United States Patent
Hwang et al.

(10) Patent No.: US 9,699,926 B2
(45) Date of Patent: Jul. 4, 2017

(54) CASE, METHOD OF MANUFACTURING CASE, AND ELECTRONIC DEVICE

(71) Applicant: Samsung Electronics Co., Ltd., Gyeonggi-do (KR)

(72) Inventors: Chang-Youn Hwang, Gyeonggi-do (KR); Won-Tae Kim, Gyeonggi-do (KR); Hak-Ju Kim, Gyeongsangbuk-do (KR); Jong-Chul Choi, Gyeonggi-do (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/210,191

(22) Filed: Mar. 13, 2014

(65) Prior Publication Data

US 2014/0268525 A1    Sep. 18, 2014

(30) Foreign Application Priority Data

Mar. 13, 2013    (KR) .................. 10-2013-0026950

(51) Int. Cl.
*H05K 5/02*    (2006.01)
*B29C 45/00*   (2006.01)
(Continued)

(52) U.S. Cl.
CPC ........... *H05K 5/0243* (2013.01); *B05D 3/144* (2013.01); *B05D 5/067* (2013.01);
(Continued)

(58) Field of Classification Search
CPC .... H05K 5/0243; H05K 5/0017; B05D 5/067; G06F 1/1626
(Continued)

(56) References Cited

U.S. PATENT DOCUMENTS

| | | | |
|---|---|---|---|
| 2008/0166505 A1 | 7/2008 | Huang et al. | |
| 2009/0068425 A1* | 3/2009 | Suzuki | B05D 5/067 428/209 |

(Continued)

FOREIGN PATENT DOCUMENTS

| | | | |
|---|---|---|---|
| EP | 0256428 A2 | 2/1988 | |
| EP | 0256428 A3 | 2/1989 | |

(Continued)

OTHER PUBLICATIONS

Extended European Search Report dated Jun. 26, 2015 in connection with European Patent Application No. 14157800.5; 7 pages.

(Continued)

*Primary Examiner* — Tuan T Dinh
*Assistant Examiner* — Rockshana Chowdhury

(57) ABSTRACT

A case for an electronic device includes an injection preform having a recess on at least one portion of a surface thereof, a deposition layer deposited on a surface of the injection preform, and a paint layer formed on the deposition layer. The deposition layer may directly contact a surface of the injection preform. A method of manufacturing a case includes injection-molding an injection preform having a recess on a surface thereof, forming a deposition layer directly contacting a surface of the injection preform, and forming a paint layer on the deposition layer.

22 Claims, 8 Drawing Sheets

(51) Int. Cl.
  *G06F 1/16* (2006.01)
  *B05D 3/14* (2006.01)
  *B05D 5/06* (2006.01)
  *H05K 5/00* (2006.01)

(52) U.S. Cl.
  CPC ........ *B29C 45/0053* (2013.01); *G06F 1/1626* (2013.01); *H05K 5/0017* (2013.01); *B29C 2045/0079* (2013.01)

(58) Field of Classification Search
  USPC .................................................. 361/679.01
  See application file for complete search history.

(56) References Cited

U.S. PATENT DOCUMENTS

| | | | | |
|---|---|---|---|---|
| 2009/0323292 | A1* | 12/2009 | Hwang | G06F 1/1615 361/730 |
| 2010/0096771 | A1* | 4/2010 | Choi | B29C 45/0053 264/249 |
| 2010/0258971 | A1 | 10/2010 | Sun | |
| 2011/0020613 | A1* | 1/2011 | Kim | B05D 5/068 428/187 |
| 2011/0081513 | A1 | 4/2011 | Hwang et al. | |
| 2011/0186347 | A1* | 8/2011 | Zhang | B29C 43/021 174/546 |
| 2011/0250400 | A1 | 10/2011 | Lee et al. | |
| 2013/0075941 | A1* | 3/2013 | Chang | B29C 45/14311 264/1.7 |

FOREIGN PATENT DOCUMENTS

| | | | |
|---|---|---|---|
| EP | 2100714 A1 | 9/2009 | |
| EP | 2374592 A2 | 10/2011 | |
| EP | 2374592 A3 | 1/2012 | |
| KR | 10-0992109 | 4/2010 | |
| KR | 1020100035982 | * 4/2010 | ............... G06F 1/16 |
| KR | 10-2011-0110951 | 10/2011 | |
| KR | 10-2011-0121104 | 11/2011 | |
| KR | 10-20110121103 | 11/2011 | |

OTHER PUBLICATIONS

Foreign communication From a Related Counterpart Application, European Application No. 14157800.5-1706, Communication Pursuant to Article 94(3) EPC dated Jan. 19, 2017, 7 pages.

* cited by examiner

US 9,699,926 B2

CASE, METHOD OF MANUFACTURING CASE, AND ELECTRONIC DEVICE

CROSS-REFERENCE TO RELATED APPLICATION AND CLAIM OF PRIORITY

The present application is related to and claims the priority under 35 U.S.C. §119(a) to Korean Application Serial No. 10-2013-0026950, which was filed in the Korean Intellectual Property Office on Mar. 13, 2013, the entire content of which is hereby incorporated by reference.

TECHNICAL FIELD

The present disclosure relates to a case which expresses a metallic texture, and a method of manufacturing the same.

BACKGROUND

In general, electronic devices include portable communication devices, MP3 players, portable multimedia players (PMPs), and electronic books, and any suitable devices by which users can access various contents while carrying them.

If prices and functions of electronic devices are not significantly different, users may prefer to choose the ones having appealing designs. Thus, an outer appearance of an electronic device, that is, a design of a case will be a primary factor which influences a user to select the electronic device.

A metallic material may be used to make a case of an electronic device luxurious, but it is difficult to process the metallic material into a specific shape. That is, there are many difficulties in realizing a design of a desired shape with a metallic material. Moreover, when a case of an electronic device is formed of a metallic material, the portability of the electronic device is lowered due to the weight of the material. Thus, recently, a synthetic resin which can be easily formed and processed and has a light weight is mainly used as the material of a case of an electronic device. When a case of an electronic device is injection-molded by using a synthetic resin, a non-conductive metallic material such as tin may be deposited on a surface of an injection preform to realize a metallic texture.

SUMMARY

To address the above-discussed deficiencies of the prior art, it is a primary object to provide a case which can realize an injection preform having no surface defects to supplement a surface defect when an injection preform is injection-molded, and can exclude use of a primer for increasing a coupling force of a metallic material and the injection preform.

The present disclosure also provides a case which can prevent recesses such as hairlines from being flattened while securing a coupling force with a metallic material.

In accordance with an aspect of the present disclosure, there is provided an electronic device including an outer housing forming appearance of the electronic device. The portion of the outer housing includes an injection preform having a surface with a pattern formed on at least one portion of the surface, wherein the pattern is formed by a plurality of recesses formed on the surface, a deposition layer deposited on the injection preform, and having a first surface directly contacting the surface of the injection preform, and a second surface facing an opposite direction of the first surface, and a paint layer formed on the second surface of the deposition layer, and wherein the second surface of the deposition layer has a curve substantially identical to a surface of the injection preform.

In accordance with another aspect of the present disclosure, there is provided a case for an electronic device including an injection preform having a uniform thickness, partially having a rib on an inner surface thereof, and having a recess on an outer surface thereof, a deposition layer formed by depositing a non-conductive metallic material on a surface of the injection preform, and a paint layer formed on the deposition layer, wherein a thickness of the rib is set to 50% or less of a thickness of the injection preform, and the deposition layer is provided to directly contact a surface of the injection preform to express a texture of the recess.

In accordance with still another aspect of the present disclosure, there is provided a case for an electronic device including a front surface case, and at least one case coupled to a rear surface of the front surface case, wherein at least one of the front surface case and the case includes: an injection preform forming a recess on a surface thereof, a deposition layer deposited on a surface of the injection preform; and a paint layer formed on the deposition layer, and wherein the deposition layer directly contacts a surface of the injection preform.

In accordance with yet another aspect of the present disclosure, there is provided a method of manufacturing a case for an electronic device, the method including providing an outer housing of the electronic device, wherein the providing of the outer housing includes, forming an injection preform having a surface and a pattern formed on at least one portion of the surface, wherein the pattern is formed by a plurality of recesses formed on the surface, plasma processing a surface of the injection preform, forming a deposition layer on the surface of the plasma-processed injection preform, wherein the deposition layer is deposited along a surface of the injection preform and curves of surfaces of the plurality of recesses, and has a first surface directly contacting a surface of the injection preform and surfaces of the recesses, and a second surface facing an opposite direction of the first surface, and forming a paint layer on the deposition layer.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1A:
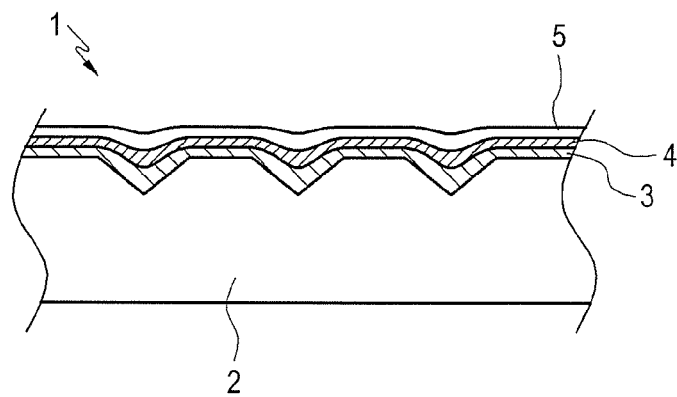
FIG. 1A illustrates a surface of a general case.

FIGS. 1A through 15, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged electronic device and its case.

Hereinafter, various embodiments of the present disclosure will be described with reference to the accompanying drawings. In the process, thicknesses of lines shown in the drawings and sizes of constituent elements may be exaggerated for clarity and convenience. Further, the following terms are defined considering their functions in the present disclosure and may be varied according to intentions and customs of a user or manager. Thus, the terms should be defined based on the contents of the entire specification. Further, although ordinal numbers such as first and second are used in the description of the embodiments of the present disclosure, their sequence may be arbitrarily determined and the description of the preceding elements may be applied in the description of the succeeding elements.

Figure 1B:
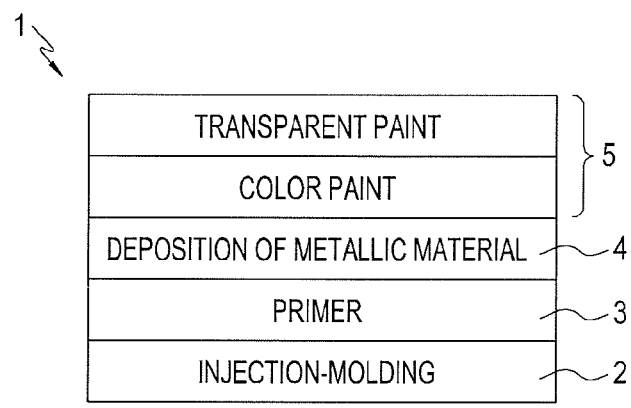
FIG. 1B illustrates a lamination structure of the case of FIG. 1A.

FIG. 1A illustrates a surface of a case for an electronic device, and FIG. 1B illustrates a lamination structure of the case of FIG. 1A. Referring to FIGS. 1A and 1B, an injection preform 2, a primer 3, a metallic material 4, and a paint layer 5 are sequentially laminated in the case 1. In order to deposit the non-conductive metallic material 4 on a surface of the injection preform 2, the primer 3 is first applied on the surface of the injection preform 2. The primer 3 is generally used to supplement a surface defect of the injection preform 2, and a coupling force between the injection preform 2 and the metallic material 4 can be increased by painting the primer 3. For example, when a coupling structure such as a coupling rib protrudes from a surface of the case 1, a surface of the injection preform can be dented at a portion where the coupling rib is formed or movement of an injection-molded product is hindered when the injection preform 2 is injection-molded. This causes a surface defect such as a weld line, a flow mark, or a gas stain on a surface of the injection preform. It is difficult to smoothly deposit the injection preform having a surface defect due to a low coupling force with the metallic material 4. Further, even though the metallic material 4 is deposited on the injection preform 2, the surface defects of the injection preform 2 are exposed to the outside of the case 1, causing the product to be inferior. Accordingly, a surface defect of the injection preform 2 is supplemented by painting the primer 3 on the surface of the injection preform 2 first.

Meanwhile, a fine pattern such as a hairline can be formed on a surface of the injection preform 2 when the injection preform 2 is injection-molded in order to realize a surface texture of the case 1. Then, the fine pattern of the injection preform 2 is flattened, making it difficult to realize a desired texture.

That is, although a surface defect can be supplemented by using the primer 3, a fine pattern such as a hairline formed for decoration of an outer appearance of the case 1 is also flattened, making it difficult to express a desired texture.

As a result, although a coupling force between the metallic material 4 and the injection preform 2 can be improved by using the primer 3, a fine pattern formed on a surface of the injection preform 2 for decoration of an outer appearance of the case 1 also can be flattened by the primer 3. Meanwhile, if the primer 3 is not used, an outer decoration such as a fine pattern formed on a surface of the injection preform 2 can match with the design of the case 1, but the coupling force in deposition of the metallic material 4 can be lowered.

Figure 2:
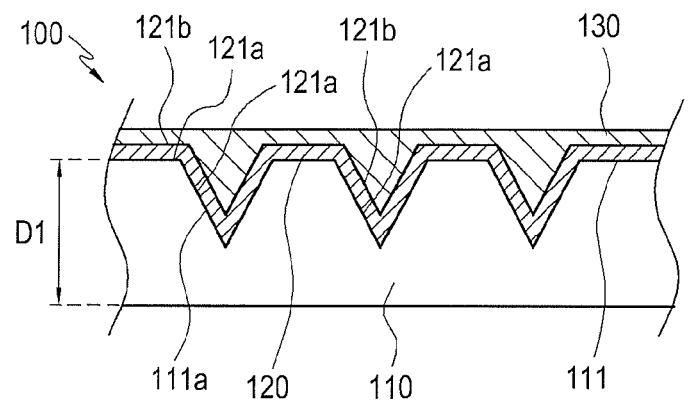
FIG. 2 is a sectional view schematically showing a structure of a case according to an embodiment of the present disclosure.

FIG. 2 is a sectional view schematically showing a structure of a case according to an embodiment of the present disclosure. Referring to FIG. 2, an outer housing 100 (hereinafter, referred to as "the case") provided in a portable electronic device includes a portion as a part thereof. The portion of the outer housing 100 includes an injection preform 2, a deposition layer 120, and a paint layer 130. In a brief description of the constituent elements of the portion, the deposition layer 120 can be formed by depositing a metallic material 4 on a surface 111 of the injection preform 2. A recess 111a such as a hairline is formed on the surface 111 of the injection preform 110, so that the deposition layer 120, which will be described below, can be directly deposited on the surface 111 of the injection preform 110 to directly express the patterns of the recess 111a. The surface 111 of the injection preform 110 can be injection-molded to allow for a uniform surface in addition to the recess 111a, that is, to prevent a surface defect so that the deposition layer 120, which will be described below, can be directly formed on the surface 111 of the injection preform 110. Hereinafter, the constituent elements will be described in detail.

The injection preform 110 includes the surface 111 of the injection preform, and a pattern formed on at least one portion of the surface 111. The pattern is formed by a plurality of recesses 111a formed on the surface. The surface 111 of the injection preform and the surfaces of the plurality of recesses 111a have depressions formed at random to have diameters or sizes of less than one micrometer. The recesses 111a form hairlines formed in the same or similar directions. In the embodiments of the present disclosure, it will be exemplified that the recesses 111a have sharp triangular bosses. However, the shapes of the recesses are not limited thereto, and can be arbitrarily changed according to a design, configuration, or shape of the outer housing 110. The surface of the injection preform should be formed uniformly such that the deposition layer 120 can directly contact the surface of the injection preform. When the case 100 is provided in a portable electronic device, in detail, the portable terminal, the depth of the recesses 111a is preferably about 6 to 8 µm. However, the depth of the recesses 111a can be arbitrarily changed according to various environments such as a design of the case 100 and a mounted article.

The injection preform is designed to have a uniform thickness D1 to prevent generation of a defect on the surface 111 of the injection preform 110. Here, the 'uniform thickness D1' means that the thickness is uniformly formed but also widely means that a surface of the injection preform is formed uniformly. Further, the expression that 'a surface of the injection preform is uniform' means that a structure hindering flows of an injection-molded product to the inner and outer sides of the injection preform, for example, a structure protruding to the surface of the injection preform like a coupling boss or coupling depression is excluded. Flows of a resin in a mold in the injection-molding process can be uniform by making the thickness D1 of the injection preform uniform. As a melted resin, that is, a resin in the mold has a uniform flow in the injection-molding process, a surface defect of the injection preform, for example, a flow mark, a weld line, or a coupling rib or a surface defect due to a structure such as a coupling rib can be prevented. Further, the injection preform 110 restricts insert injection-molding of a metal structure, for example, a nut for screw-coupling, and is seamless injection-molded to prevent generation of a seam due to an injection-molding mold. Exclusion of insert injection-molding or seamless injection-molding is also useful in securing a uniform flow of a resin in the mold. As described above, the injection preform has a uniform thickness D1 and restricts insert injection-molding, and is seamless injection-molded to prevent a surface defect on the surface of the injection preform due to the injection-molding thereof.

Figure 3:
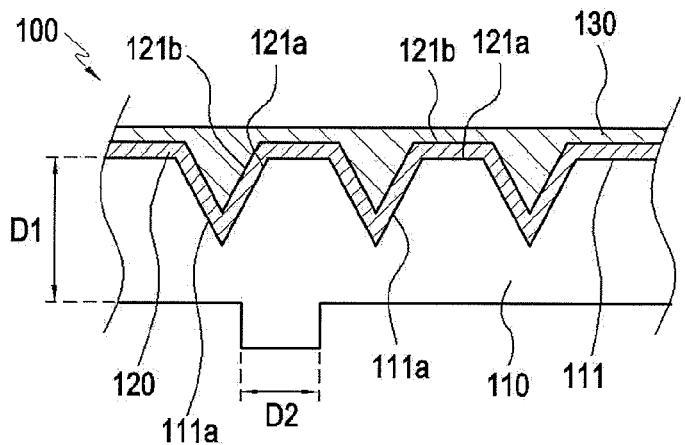
FIG. 3 is a view schematically showing that a rib is formed on an inner surface of an injection preform of the case of FIG. 2.

FIG. 3 is a view schematically showing that a rib is formed on an inner surface of an injection preform of the case of FIG. 2. Referring to FIG. 3, the injection preform is preferably formed by seamless injection-molding, but a rib 140 can be formed on an inner surface of the injection preform to prevent distortion during injection-molding of the injection preform. When the rib 140 is formed in the injection preform, generation of a defect of the surface 111 due to the rib 140 on the surface 111 of the injection preform is reduced by minimizing the number of the ribs 140 and setting the thickness D of the rib 140 to 50% or less of the thickness D of the injection preform. In forming the rib 140, a flow of the resin can be maintained uniformly by designing a shape in which the rib 140 extends in the flow direction of the resin in the injection-molding process. Further, although not shown, if a high-speed flow resin flows rapidly without staying in the mold, a surface defect due to the flow of the resin can be minimized in the injection-molding process. As described above, a flow of the resin can be made uniform and rapid by restricting a structure for obstructing the flow of the resin and making a structure formed on a surface of the injection preform match with the flow direction of the resin in the mold. Through the design and injection-molding, generation of a surface defect except for the recess 111a can be restricted on the surface of the injection preform.

Figure 4:
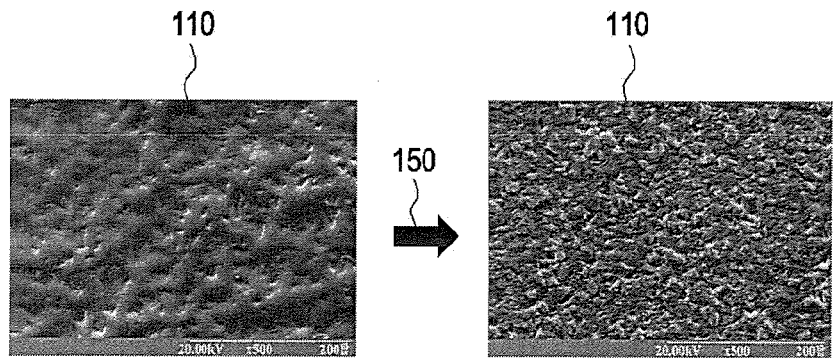
FIG. 4 shows views of a surface immediately after the injection preform of the case of FIG. 2 is injection molded and an appearance immediately after the surface of the injection preform is plasma pre-processed.

FIG. 4 shows views of a surface immediately after the injection preform of the case of FIG. 2 is injection-molded and an appearance immediately after the surface of the injection preform is plasma pre-processed. First, the deposition layer 120 is directly formed on the surface 111 of the injection preform as shown in FIG. 2, in which case, the surface 111 of the injection preform is plasma pre-processed 150 before the metallic material is deposited to increase the coupling force of the metallic material and the surface 111 of the injection preform. If the surface 111 of the injection preform is plasma pre-processed 150, a roughness of the surface 111 of the injection preform is changed as shown in FIG. 4. That is, the surface 111 of the injection preform becomes rougher, an attachment surface on which the metallic material can be attached is increased, and the metallic material can be easily deposited.

Figure 5:
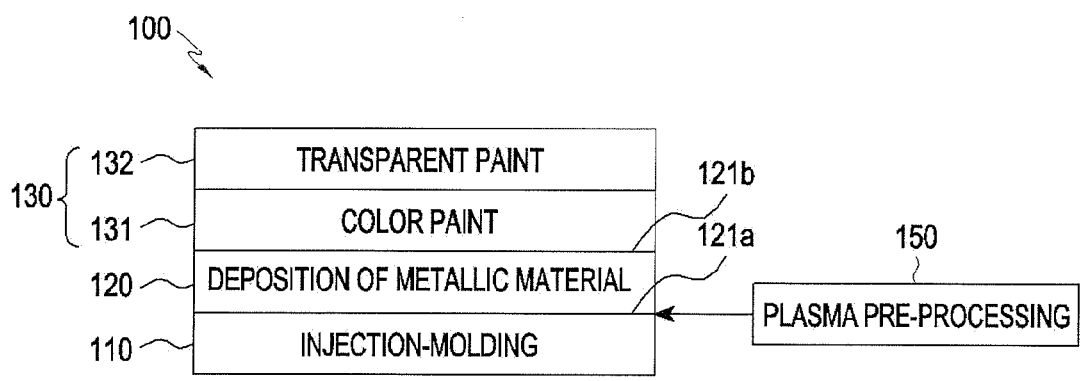
FIG. 5 illustrates a lamination structure of the case of FIG. 2.

FIG. 5 illustrates a lamination structure of the case of FIG. 2. Referring to FIG. 5, the injection preform, the deposition layer 120, and the paint layer 130 are sequentially formed in the case 100. The case 100 is injection-molded to have a uniform surface 111 except for the recess 111a, and the deposition layer 120 is directly formed on the surface of the injection preform.

The deposition layer 120 is formed by depositing a metallic material so that the case 100 can have a texture of a metallic material. A metallic layer includes a metallic material. Further, the case 100 of the electronic device 10, which will be described below, can be deposited by a conductive metallic material, considering a radiation performance of an antenna. The material of the deposition layer 120 is not limited to the above-described examples, and the deposition layer 120 also can be formed of a conductive layer as long as it does not influence a radiation performance of an antenna and the modification thereof can include any material capable of having a metallic texture. In detail, the deposition layer 120 is deposited along a surface of the injection preform and curved surfaces of the plurality of recesses 111a. The deposition layer 120 has a first surface 121a directly contacting a surface of the injection preform and surfaces of the recesses 111a, and a second surface 121b facing an opposite side of the first surface 121a. The paint layer 130 is formed on the second surface 121b of the deposition layer 120. The paint layer 130, which will be described below, is formed on the second surface 121b of the deposition layer 120. The first surface 121a of the deposition layer 120 includes the recesses 111a, in detail, parts attached to at least one portion of the surfaces of the recesses. Further, the second surface 121b includes a curve substantially identical to the surface of the injection preform and the curves of the plurality of recesses 111a. When the case 100 is provided in a portable electronic device, in detail, a portable terminal, the depth of the recesses 111 can be set to about 6 to 8 µm, and thus the depth of the deposition layer 120 can be set to about 0.5 µm. The thickness of the deposition layer 120 can be arbitrarily changed to correspond to the design of the case 100 or the shape of the recesses 111a such as the depth of the recesses 111a.

The paint layer 130 is provided at an upper portion of the deposition layer 120, in detail, on the second surface 121b. The paint layer 130 is a chromatic or achromatic and transparent or translucent structure. The paint layer 130 includes a first paint layer 131 and a second paint layer 132. The first paint layer 131 corresponds to a surface 111 of the injection preform which has a metallic texture through the deposition layer 120, and realizes various color textures. The second paint layer 132 is a transparent structure, and is formed on the first paint layer 131 to add a glossy texture to the surface 111 of the injection preform and protect the painted surface 111 of the injection preform 110 painted from the outside. When the case 100 is provided in a portable electronic device, in detail, a portable terminal, the depth of the recesses 111a can be set to 6 to 8 μm, the thickness of the deposition layer 120 can be set to about 0.5 μm, and the thickness of the paint layer can be set to 20 to 30 μm as described above. As described above, the case 100 does not require the painting of the primer as a surface defect of the injection preform is minimized. Thus, the deposition layer 120 can be formed to directly contact the surface 111 of the injection preform. Further, as the primer is not painted, an outer decoration realized by the recesses 111a such as a hairline can be clearly realized. Further, if the deposition layer 120 is formed to directly contact the surface of the injection preform, the texture of the recesses 111a can be formed.

Figure 6:
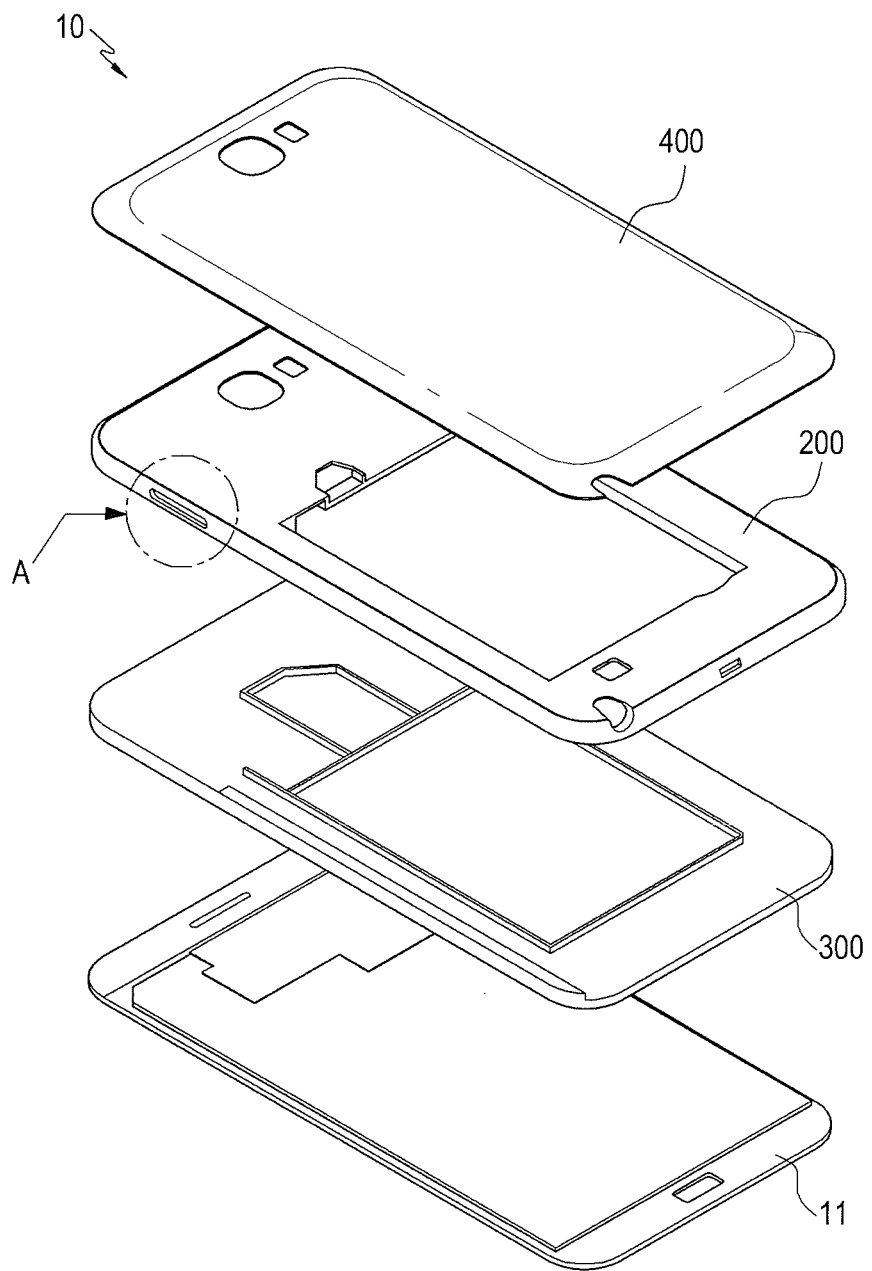
FIG. 6 is an exploded perspective view showing an electronic device including cases according to the embodiment of the present disclosure.
Figure 7:
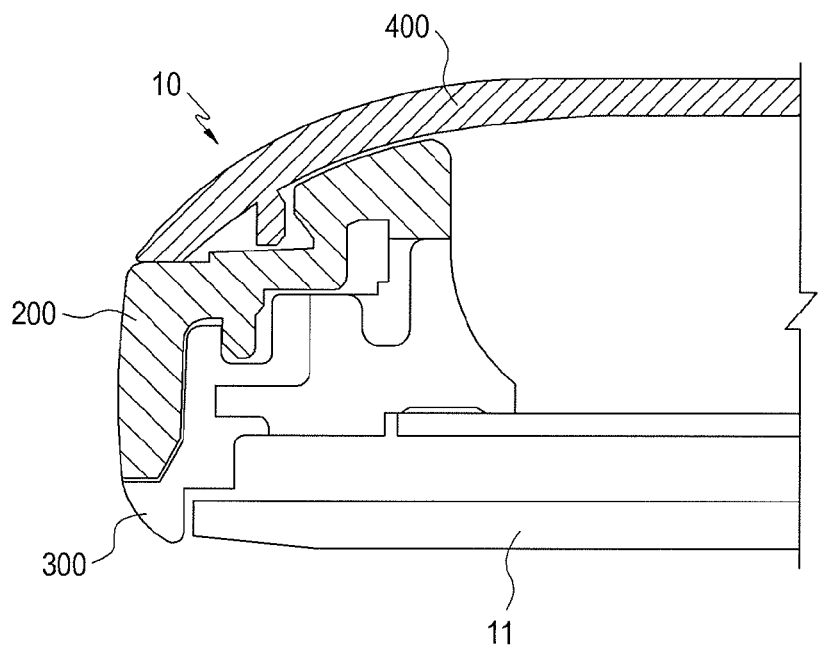
FIG. 7 is a sectional view showing the electronic device of FIG. 6.

FIG. 6 is an exploded perspective view showing an electronic device including cases according to the embodiment of the present disclosure. FIG. 7 is a sectional view showing the electronic device of FIG. 6. First, among the contents and configurations described below, the same contents and configurations of the case 1 will be applied to the above description. However, there are also configurations having different reference numerals for convenience of the following description of the contents. Referring to FIGS. 6 and 7, the electronic device 10 includes a large-sized display 11. The housing (hereinafter, referred to as 'the case') of the electronic device includes a first surface 311 (having the same meaning as 'a surface 311 of a third injection-molded portion 310a', which will be described below) facing the same direction as that of the display, a second surface 411 (having the same meaning as 'a surface 411 of an injection preform 410', which will be described below), and a side surface 211 (having the same meaning as 'a surface 211 of a first injection-molded portion 210a') connecting the first surface 311 and the second surface 411. The portion of the embodiment of the present disclosure, which has been described above preferably forms at least one portion of the side surface. However, the above-described 'portion' is formed on at least one portion of one or more of the first surface 311 and the second surface 411 as well as the side surface 211, and can be arbitrarily changed according to a design or shape of the portable electronic device.

It will be exemplified in this embodiment that the portable electronic device is a portable terminal. Accordingly, the case can include a front surface case 300, a side surface case 200 having a side surface 211, and a battery cover 400 having a third surface 411. As described above, the portion according to the embodiment of the present disclosure forms at least one portion in the case of the electronic device 10, that is, at least one of the front surface case 300, the side surface case 200, and the battery cover 400. Further, the front surface case 300, the side surface case 200, and the battery cover 400 are manufactured through the same structure or manufacturing method as that of the case 100, and preferably, can be manufactured such that the side surface case 200 has the same form as that of the above-described case 100.

In detail, at least one of the front surface case 300, the side surface case 200, and the battery cover 400 of the electronic device 10 has an injection preform 210, 310, and 410 (see FIGS. 8,11, and 12), a deposition layer 120 (see FIGS. 8 to 12), and a paint layer 130 (see FIGS. 8 to 12), and the deposition layer 120 is configured to directly contact the surface 211, 311, and 411 of the injection preform 210, 310, and 410. The configurations of the deposition layer 120 or the paint layer 130 are the same as the above-described contents, which will be applied to the deposition layer 120 and the paint layer 130. Recesses 211a, 311a, and 411a (see FIGS. 8, 11, and 12) such as a hairline are formed on a surface 211, 311, and 411 (corresponding to 'the surface 211 of the first injection-molded portion 210a', 'the surface 311 of the third injection-molded portion 310a', and 'the surface 411 of the injection preform 410') (see FIGS. 8, 11, and 12) of the injection preform 210, 310, and 410 of the battery cover 400 of the front surface case 300, the side surface case 200, or the battery cover 400. Further, the thickness D1 of the injection preform 210, 310, and 410 provided in a portion exposed to the outside can be set uniformly, and seamless injection-molding can be performed to restrain generation of a seam to a surface exposed to the outside.

Figure 9:
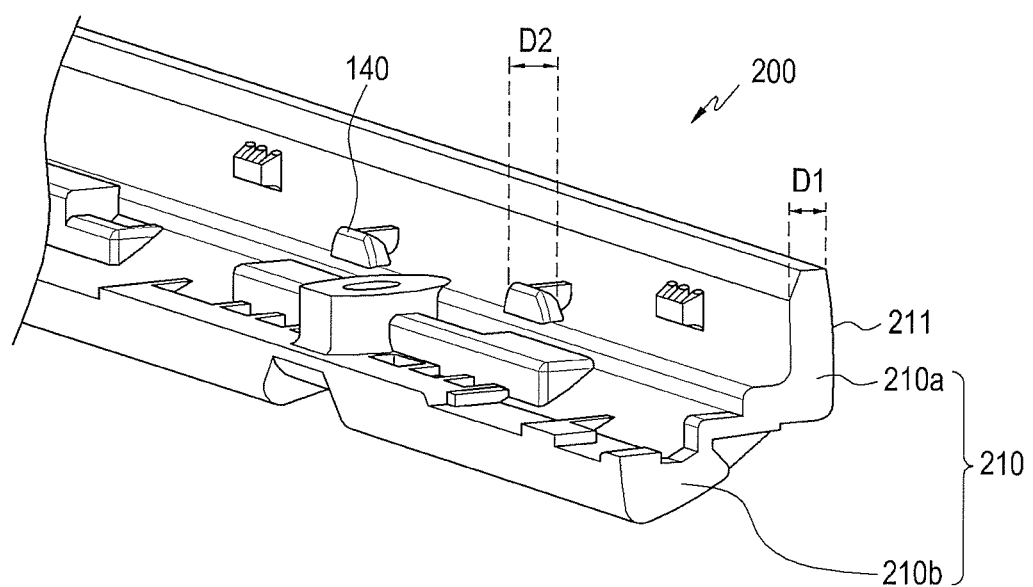
FIG. 9 is a perspective view showing an inner surface of the side case of FIG. 6.

In addition, a rib 140 can be provided on an inner surface of the injection preform 210, 310, and 410 to prevent distortion of the injection preform 210, 310, and 410 when the injection preform 210, 310, and 410 is injection-molded (see FIG. 9). However, the rib 140 preferably has a thickness D2 of 50% or less of the thickness D1 of the injection preform. Generation of a surface defect due to the rib 140 on the surface of the injection preform 210, 310, and 410 where the rib 140 is located can be restrained by restricting the thickness of the rib 140. Hereinafter, the cases of the portable terminal 10 will be described in detail.

Figure 8:
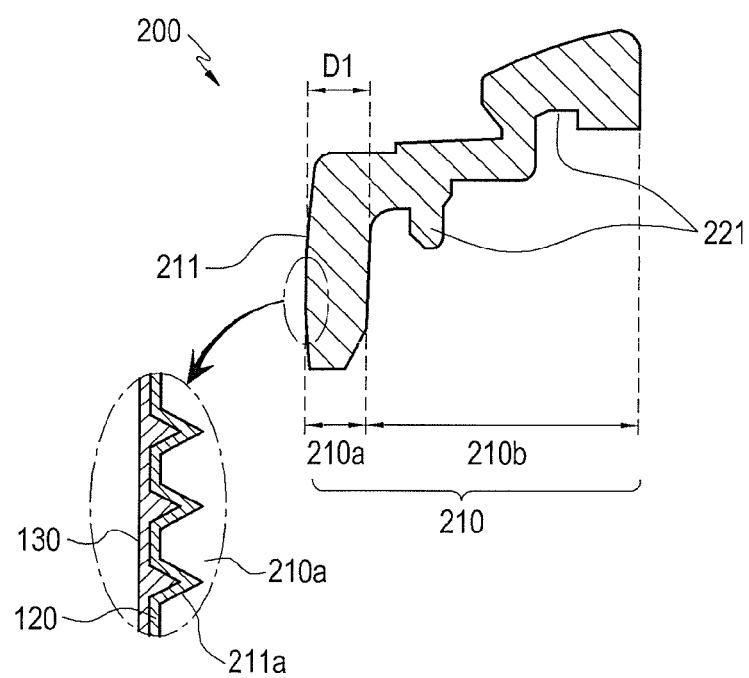
FIG. 8 shows enlarged views showing a side case of the electronic device of FIG. 6 and a surface of the side case.

FIG. 8 shows enlarged views showing a side case of the electronic device of FIG. 6 and a surface of the side case. FIG. 9 is a perspective view showing an inner surface of the side case of FIG. 6. Referring to FIGS. 8 and 9, the side surface case 200 of the electronic device 10 includes an injection preform 210, a deposition layer 120, and a paint layer 130, and the deposition layer 120 is configured to directly contact the surface of the injection preform 210. The contents of the deposition layer 120 and the paint layer 130 are applied to the above-described contents.

The side surface case 200 is provided between the front surface case 300 and the battery cover 400 to form a side surface of the electronic device 10 (see FIGS. 6 and 7). The side surface case 200 is coupled to a rear surface of the front surface case 300, and a portion corresponding to the side surface of the electronic device 10 is exposed. The injection preform 210 constituting the side surface case 200 can be classified into a first injection-molded portion 210a and a second injection-molded portion 210b. The first injection-molded portion 210a is located between the first surface case 300 and the battery cover 400 to form a side surface of the electronic device 10, and a recess 211a such as a hairline is formed on the surface 211 of the first injection-molded portion 210a to be exposed to the outside (see FIG. 7). It is limited to form a separate structure such as a boss or a recess to be coupled to the front surface case 300 or the battery cover 400 on the inner and outer surfaces of the first injection-molded portion 210a, and the first injection-molded portion 210a is formed to have a certain shape and a uniform thickness D1. Accordingly, as described above, a surface defect such as a flow mark or a weld line on the surface 211 of the first injection-molded product 210 is prevented. Further, the first injection-molded portion 210a limits formation through insert injection-molding to prevent generation of a surface defect such as a seam on the surface 211 of the first injection-molded portion 210a, and is seamless injection-molded. In addition, when the rib 140 protrudes from the inner surface of the first injection-molded portion 210a to prevent distortion of the first injection-molded portion 210a due to injection-molding or to couple the front surface case 300 or the battery cover 400, the rib 140 is formed to have the thickness D1 of 50% or less of the thickness D1 of the first injection-molded portion 210a. Accordingly, after the injection preform 210 is injection-molded, a surface defect such as a recess which is generated by the rib 140 can be restrained from being generated on the surface 211 of the first injection-molded portion 210a where the rib 140 is located. Thus, the surface 211 of the first injection-molded portion 210a can realize a surface where a surface defect is prevented, except for the recess 211a, and the deposition layer 120 depositing the metallic material can directly contact the surface 211 of the first injection-molded portion 210a.

The second injection-molded portion 210b extends from the first injection-molded portion 210a and is a part coupled to a rear surface of the front surface case 300, and is located inside the electronic device 10 (see FIG. 7). Since the second injection-molded portion 210b is not exposed to the outside, it can be free from generation of a surface defect. Accordingly, unlike the first injection-molded portion 210a, seamless injection-molding is not inevitably necessary and insert injection-molding can be used. Further, various types of coupling members can be provided to couple the front case 300 and the battery cover 400 of the electronic device 10.

The metallic material is deposited on a surface of the injection preform 210 to form the deposition layer 120, in which case, in the case of the side surface case 200, the deposition layer 120 is formed on the surface of the first injection-molded portion 210a exposed to the outside and the second injection-molded portion 210b provided inside the electronic device 10 and being not exposed to the outside can selectively form the deposition layer 120. That is, the deposition layer 120 may be or may not be formed in the second injection-molded portion 210b. When the deposition layer 120 is not formed in the second injection-molded portion 210b, the second injection-molded portion 210b has only the injection preform 210, reducing manufacturing costs. However, an arbitrary configuration, for example, a coating layer (not shown) by which a separate coating for reinforcement can be made can be added to the second injection-molded portion 210b.

Figure 10:
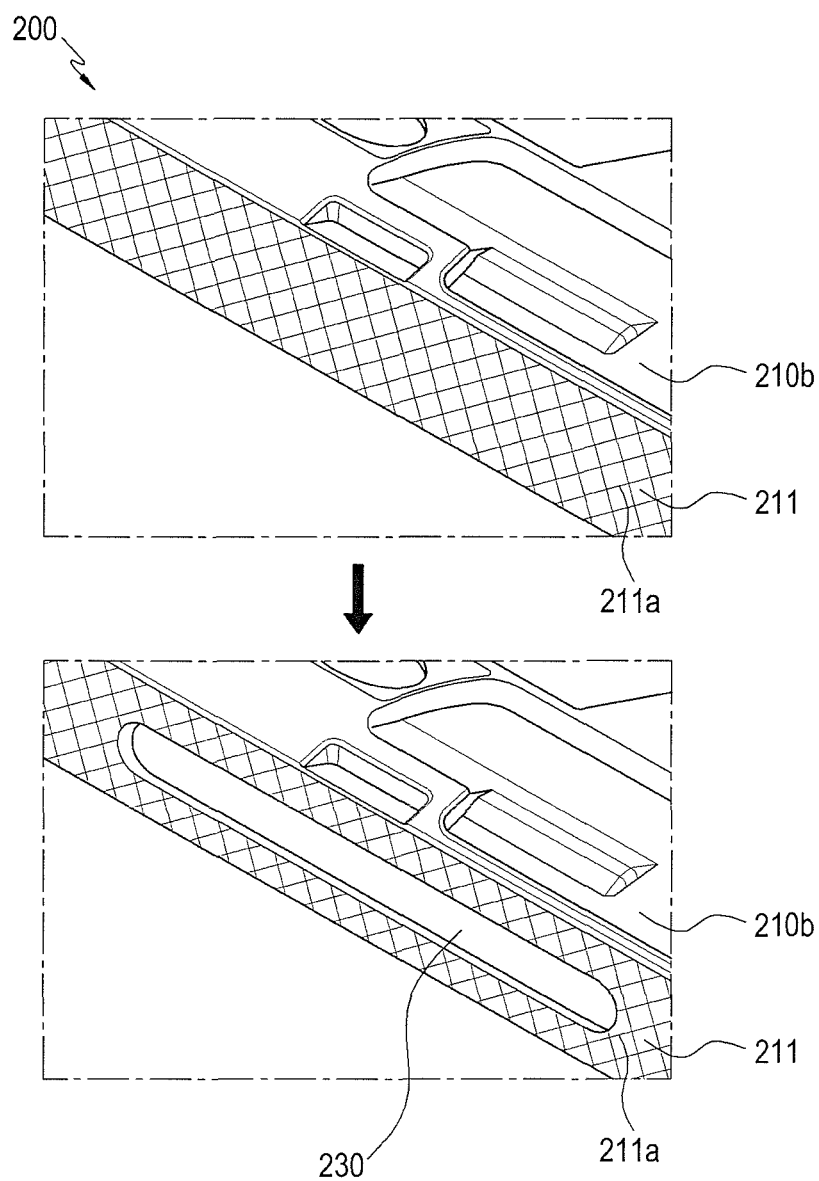
FIG. 10 illustrates a process of processing the side case of the electronic device of FIG. 6 to form a hole.

FIG. 10 shows views of a process of processing the side case of the electronic device of FIG. 6 to form a hole. Referring to FIG. 10, an external connector (not shown), for example, an earphone, an external charging line, or a data cable is connected to the side surface case 200 of the electronic device 10, or a hole 230 for providing a button such as a power button or a volume button is located in the side surface case 200 of the electronic device 10. The hole 230 is formed through post-processing such as CNC machining after the first injection-molded portion 210a is formed. Thus, when a structure for forming a hole or a recess in the injection preform to be formed in a mold, it obstructs a flow of the resin. In the case according to the embodiment of the present disclosure, a structure which obstructs a flow of the resin in the mold can be excluded by forming the hole 230 or recess through post-processing. Accordingly, the thickness D1 of the first injection-molded portion 210a can be made uniform, and the structure of the injection preform 210 can prevent generation of a surface defect on the surface of the first injection-molded portion 210a.

Figure 11:
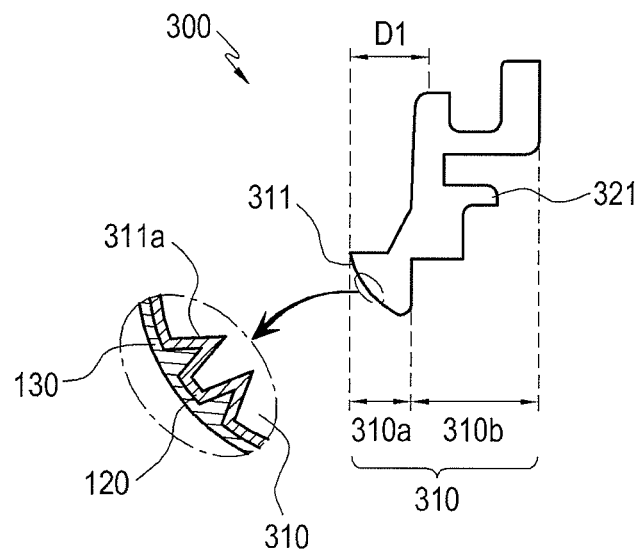
FIG. 11 illustrates enlarged views of a front case of the electronic device of FIG. 6 and a surface of the front case.

FIG. 11 shows enlarged views of a front case of the electronic device of FIG. 6 and a surface of the front case. Referring to FIG. 11, the front surface case 300 includes an injection preform 310, a deposition layer 120, and a paint layer 130, and a deposition layer 120 is configured to directly contact the surface 311 of the injection preform 310. In detail, the front case 300 can be classified into a third injection-molded portion 310a whose surface is exposed to the outside and a fourth injection-molded portion 310b not exposed to the outside, for convenience' sake. The third injection-molded portion 310a is provided along a periphery of the display 11 provided on the front surface of the electronic device 10, and is a part exposed to the outside of the electronic device 10, in detail, the front surface of the electronic device 10. The third injection-molded portion 310a has a uniform form having no separate boss or recess on the inner and outer sides thereof, and is designed to have a uniform thickness D1. A recess 311a such as a hairline is formed on the surface 311 of the third injection-molded portion 310a, and the deposition layer 120 is formed to directly contact an upper portion of the third injection-molded portion 310a having the recess 311a, that is, a surface exposed at least to the outside. Coupling of the surface 311 is restrained by limiting insert injection-molding during formation and performing seamless injection-molding, and the deposition layer 120 can be smoothly formed in the third injection-molded portion 310a. The surface 311 of the third injection-molded portion 310a can realize a surface on which a surface defect except for the recess 311a is prevented. Accordingly, the deposition layer 120 can be directly formed on the surface 311 of the third injection-molding portion 310a by directly depositing the metallic material on the surface 311 of the third injection-molded portion 310a. Even if the deposition layer 120 is formed on the surface 311 of the third injection-molded portion 310a, the texture of the recess 311a can be expressed directly, adding a metallic texture of the front surface case 300.

The fourth injection-molded portion 310b extends from the third injection-molded portion 310a, and is located inside the electronic device 10. The fourth injection-molded portion 310b is located inside the electronic device 10, and is engaged with one surface of the side surface case 200. A coupling rib or a rib for preventing distortion can be provided in the fourth injection-molded portion 310. Since the fourth injection-molded portion 310 is not a part exposed to the outside, it may not express a metallic texture like the deposition layer 120. Accordingly, the deposition layer 120 or the paint layer 130 may not be separately provided on the surface 311 of the fourth injection-molded portion 310b. However, since the fourth injection-molded portion 310b is engaged with the above-described second injection-molded portion 210b, a coating layer (not shown) for reinforcing the fourth injection-molded portion 310b can be further formed.

That is, in the case of the front surface case 300, the deposition layer 120 is formed on the surface 311 of the third injection-molded portion 310a exposed to the outside and the deposition layer 120 can be selectively formed in the fourth injection-molded portion 310b located inside. Accordingly, the fourth injection-molded portion 310b is formed only of the injection preform 310, making it possible to reduce manufacturing costs.

Figure 12:
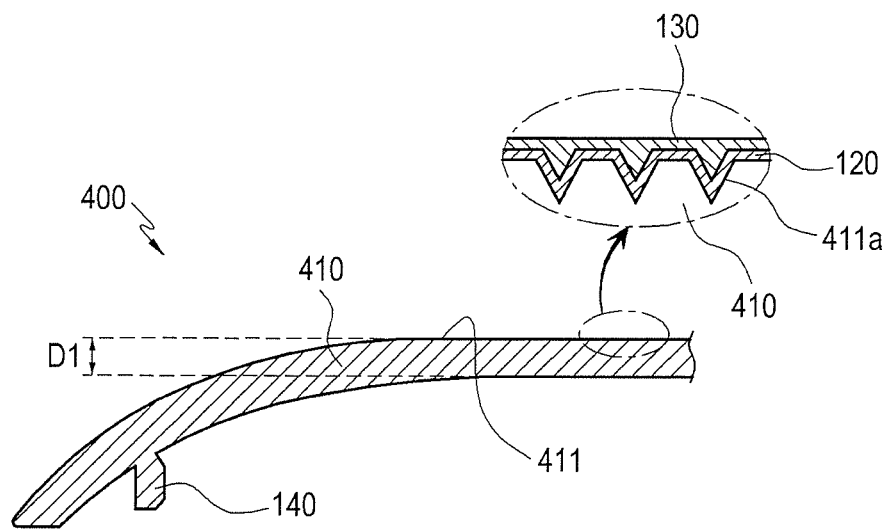
FIG. 12 illustrates enlarged views of a battery cover of the electronic device of FIG. 6 and a surface of the battery cover.

FIG. 12 shows enlarged views of a battery cover of the electronic device of FIG. 6 and a surface of the battery cover.

Referring to FIG. 12, the battery cover 400 is positioned on a rear surface of the side surface case 100, in detail, a rear surface of the second injection-molded portion 210b (see FIG. 8) to cover the rear surface of the electronic device 10 (see FIG. 7). The battery cover 400 includes an injection preform 410, a deposition layer 120, and a paint layer 130. In particular, the battery cover 400, in more detail, one surface of the injection preform 410 is entirely exposed to the outside. The battery cover 400 is injection-molded such that a recess 411a such as a hairline is formed on one surface of the injection preform 410. A metallic material is deposited on a surface 411 of the injection preform 410 where a recess 411a is formed such that the deposition layer 120 directly contacts the surface 411 of the injection preform 410. Accordingly, the texture of the recess 411a formed on the surface 411 of the injection preform 410 can be expressed directly. In order that the deposition layer 120 directly contacts the surface 411 of the injection preform 410, the surface 411 of the injection preform 410 should prevent a surface defect except for the recess 411a. To this end, the thickness D1 of the injection preform 410 should be uniform. If the thickness D1 of the injection preform 410 is uniform, generation of a surface defect such as a flow mark or a weld line generated when the injection preform 410 is injection-molded can be prevented. Further, the injection preform 410 is preferably seamless injection-molded to avoid insert injection-molding and prevent generation of a surface defect such as a seam. A rib 40 for attachment or detachment of the battery cover 400 can protrude from a periphery of an inner surface of the injection preform 410. When the rib 140 is located, a surface defect such as a recess can be generated on the surface 411 of the injection preform 410, that is, the outer surface of the injection preform 410. A surface defect of the battery cover 400 due to the rib 140 can be prevented by limiting the thickness D1 of the rib 140 to 50% or less of the thickness D1 of the injection preform 410. Accordingly, the surface 411 of the injection preform 410 can realize a surface where a surface defect except for the recess 411a is prevented so that the metallic material can be deposited to directly contact the surface 411 of the injection preform 410.

Although not shown, at least one of the side surface case 200, the front surface case 300, and the battery cover 400 of the above-described portable terminal 10 includes an injection preform having a recess, a deposition layer, and a paint layer, and the deposition layer is formed to directly contact a surface of the injection preform, and then, a surface of the injection preform is plasma pre-processed to increase a coupling force of the deposition layer (see FIG. 5). If the surface of the injection preform 210, 310, and 410 is plasma pre-processed 150 before the metallic material is deposited after the injection preform 210, 310, and 410 is injection-molded, a surface roughness of the injection preform 210, 310, and 410 is varied. Accordingly, a coupling force between the surface of the injection preform 210, 310, and 410 and the metallic material is increased as a surface area of the injection preform 210, 310, and 410 where metal particles are deposited is plasma pre-processed, making it possible to easily form the deposition layer on the surface of the injection preform.

Figure 13:
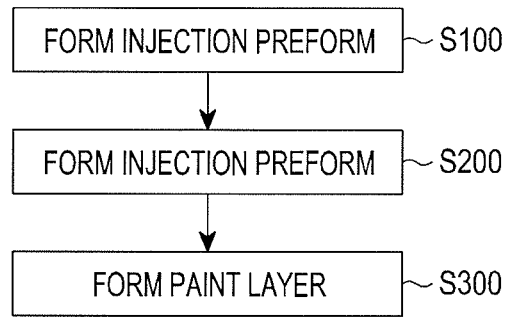
FIG. 13 is a flowchart showing a method of manufacturing a case according to the embodiment of the present disclosure.

FIG. 13 is a flowchart showing a method of manufacturing a case according to the embodiment of the present disclosure. In a description of the method of manufacturing the case, which will be described below, FIG. 2 will be referenced together with FIG. 13. Referring to FIG. 13, the method of manufacturing the electronic device according to various embodiments of the present disclosure includes a step of providing the outer housing 100 of the electronic device 10. The step of providing the outer housing includes an injection-molding step S100, a plasma processing step S150 (see FIG. 14), a deposition layer forming step S200, and a step S300 of forming a paint layer.

In detail, in the injection-molding step S100, the injection preform 110 is injection-molded. As discussed above, the injection preform 110 has a pattern on the surface 111 thereof and at least one portion of the surface 111. Further, the pattern is formed by the plurality of recesses 111a formed on the surface. Further, the injection preform restricts insert injection-molding, and is formed through seamless injection-molding where the thickness D1 is uniform and formation of a separate structure such as a boss or a recess is excluded. It has been discussed that the injection preform can minimize a surface defect.

The injection preform 110 which prevents a surface defect except for the recess 111a is formed by restricting insert injection-molding and performing seamless injection-molding while uniformly maintaining the thickness D1.

Figure 14:
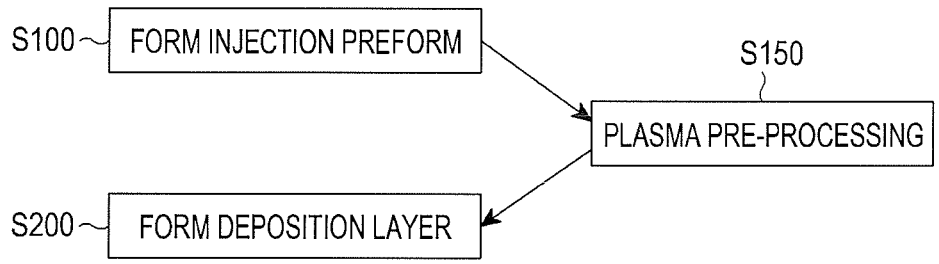
FIG. 14 is a block diagram showing a surface processing process of an injection preform in the manufacturing method of FIG. 13 in detail.

FIG. 14 is a block diagram showing a surface processing process of an injection preform in the manufacturing method of FIG. 13 in detail. Referring to FIG. 14, a plasma pre-processing 150 step S150 is performed to increase a coupling force between the surface 111 of the injection preform 110 where the recess 111a is realized and the metallic material. That is, the surface of the injection preform 110 where a surface defect except for the recess 111a is restrained varies the surface roughness through plasma pre-processing 150 (see FIG. 4). Accordingly, an attachment area where the metallic material can be deposited increases on the surface of the injection preform 110, and accordingly, the coupling force of the metallic material increases and the deposition layer 120 can be easily formed.

In the step S200 of forming the deposition layer, the metallic material is deposited to realize a metallic texture on the surface 111 of the plasma pre-processed injection preform 110. As discussed above, the injection preform 110 which prevents a surface defect except for the recess 111a is formed by restricting insert injection-molding and performing seamless injection-molding while uniformly maintaining the thickness D1. Accordingly, the metallic material can be directly deposited on the surface of the injection preform 110. That is, even if separate primer painting is not performed, the deposition layer 120 can directly contact the surface of the injection preform 110. In this way, as a decoration effect of the recess 111a can be directly realized by forming the deposition layer 120 such that the deposition layer 120 directly contacts the surface of the injection preform 110 without painting a primer, the decoration effect of the recess 111a can be directly realized. Further, as described above, when the deposition layer 120 is formed (S200), the deposition layer 120 is deposited along the surface 111 of the injection preform 110 and the surfaces of the recesses 111a. A first surface 121a directly contacting the surface 111 of the injection preform and the surfaces of the recesses 111a, and a second surface 121b facing an opposite direction of the first surface 121a are formed. In particular, the second surface 121b has a curve similar to the curve of the surface 111 of the injection preform 110 and the curves of the surfaces of the plurality of recesses 111a. Accordingly, the patterns of the recesses 111a can be directly expressed.

Figure 15:
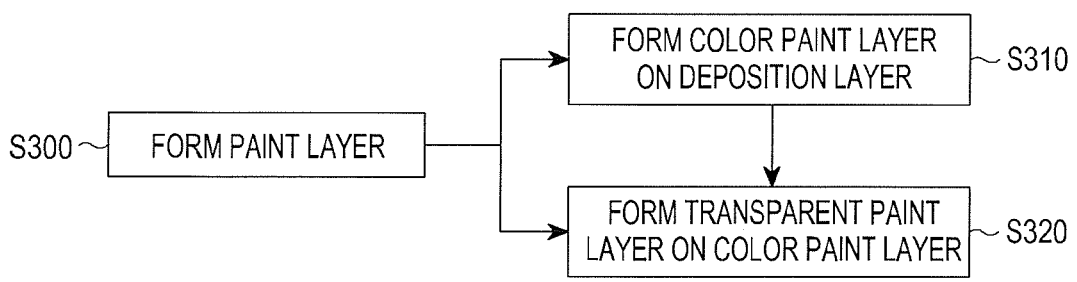
FIG. 15 is a block diagram showing a manufacturing process of a paint layer in the manufacturing method of FIG. 15.

FIG. 15 is a block diagram showing a manufacturing process of a paint layer in the manufacturing method of FIG. 13. Referring to FIG. 15, the step of forming the paint layer 130 is a process of realizing various color textures and glossy textures on the deposition layer 120, in detail, the second surface 121b of the deposition layer 120 and protecting the deposition layer 120 (S300). First, the first paint layer 131 is formed on the second surface 121b of the deposition layer 120 to have various color textures by using an achromatic or chromatic and translucent or transparent material (S310). The second paint layer 132 formed of a transparent material is formed to protect the first paint layer 131 and realize a glossy texture on the first paint layer 131 (S320).

As described above, in the case 100 and the method of manufacturing the case 100 according to the various embodiments of the present disclosure, the injection preform 110 is formed to have a surface having no surface defect except for the recess 111a. Further, a coupling force by which the metallic material is attached to a surface of the injection preform can be improved by plasma pre-processing 150 a surface of the injection preform before the deposition layer 120 is formed. This allows the deposition layer 120 to be formed on a surface of the injection preform 110 even if a primer is not used, and the texture of the recess 111a on the surface of the injection preform 110 can be directly realized even after the deposition layer 120 or the paint layer 130 is formed.

According to the various embodiments of the present disclosure, a surface defect is not exposed even if use of a primer is excluded, a metallic material can be directly deposited on a surface of an injection preform, and a surface decoration effect such as a recess together with a metallic texture can be realized on an outer surface of a case of an electronic device. According to the various embodiments of the present disclosure, a manufacturing process for a case can be simplified by excluding a process of painting a primer while realizing both a metallic texture and a decoration effect on the surface of the case.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An electronic device comprising:
    an outer housing forming an external appearance of the electronic device,
    wherein a portion of the outer housing comprises:
        an injection preform having a surface with a pattern, the pattern formed by a plurality of recesses formed on the surface, wherein the surface of the injection preform is processed to be roughened through a plasma process;
        a deposition layer deposited on the plasma-processed surface of the injection preform, and having a first surface directly contacting on the surface of the injection preform, and a second surface facing an opposite direction of the first surface, wherein the second surface of the deposition layer comprises a plurality of recesses; and
        a paint layer formed on the second surface of the deposition layer and having a flat surface, and
    wherein the plurality of recesses of the second surface of the deposition layer have substantially identical shapes to the plurality of recesses of the injection preform,
    wherein the injection preform includes a first injection-molded portion and a second injection-molded portion, the first injection-molded portion corresponds to a side of the electronic device, and the second injection-molded portion extends from the first injection-molded portion to an inside of the electronic device and includes a coupling member to couple to the electronic device.

2. The electronic device of claim 1, wherein the deposition layer is formed of a metallic material.

3. The electronic device of claim 1, wherein the paint layer is formed of a transparent or translucent material.

4. The electronic device of claim 1, wherein the surface of the injection preform for injection and the surfaces of the plurality of recesses have recesses having a diameter or size of one micrometer or less and formed at random.

5. The electronic device of claim 4, wherein the first surface of the deposition layer has a part to which at least one portion of the surfaces of the recesses is attached.

6. The electronic device of claim 1, wherein the electronic device comprises a portable terminal.

7. The electronic device of claim 6, wherein the electronic device is a display,
    wherein the outer housing comprises:
        a front surface facing in a same direction as the display does;
        a back surface facing in an opposite direction of the front surface;
        a side surface connecting the first surface and the second surface, and
    wherein the portion forms at least one portion of the side surface.

8. The electronic device of claim 6, wherein the electronic device comprises a display,
    wherein the outer housing comprises:
        a front surface facing in the same direction as the display does;
        a back surface facing an opposite direction of the front surface; and
        a side surface connecting the first surface and the back surface, and
    wherein the portion forms at least one portion of one or more of the front surface and the back surface.

9. The electronic device of claim 1, wherein the recesses form hairlines formed in a substantially same direction.

10. The electronic device of claim 1, wherein the injection preform has a uniform thickness.

11. The electronic device of claim 1, wherein a rib is provided on an inner surface of the injection preform, and the rib is formed to be 50% or less of a thickness of the injection preform.

12. The electronic device of claim 1, wherein the deposition layer is formed of a non-conductive material.

13. A case for an electronic device, comprising:
    an injection preform having a uniform thickness, partially having a rib on an inner surface thereof, and having a plurality of recesses on an outer surface thereof, wherein the outer surface of the injection preform is processed to be roughened through a plasma process;
    a deposition Layer formed of a non-conductive metallic material deposited on the plasma-processed surface of the injection preform wherein a surface of the deposition layer comprises a plurality of recesses; and
    a paint layer formed on the deposition layer and having a flat surface,
    wherein a thickness of the rib is set to 50% or less of a thickness of the injection preform, and the deposition layer is provided to directly contact on the surface of the injection preform to express a texture pattern, wherein the plurality of recesses of the surface of the deposition layer have substantially identical shapes to the plurality of recesses of the of the injection preform, wherein the injection preform includes a first injection-molded portion and a second injection-molded portion, the first injection-molded portion corresponds to a side of the electronic device, and the second injection-molded portion extends from the first injection-molded portion to an inside of the electronic device and includes a coupling member to couple to the electronic device.

14. A case for an electronic device, comprising:
a front surface case; and
at least one case coupled to a rear surface of the front surface case,
  wherein at least one of the front surface case and the case comprises:
    an injection preform forming a plurality of recesses on a surface thereof, wherein the surface of the injection preform is processed to be roughened through a plasma process;
    a deposition layer deposited on the plasma-processed surface of the injection preform; and
    a paint layer formed on the deposition layer and having a flat surface, and
  wherein the plurality of recesses of the surface of the deposition layer have substantially identical shapes to the plurality of recesses of the surface of the injection preform,
  wherein the injection preform includes a first injection-molded portion and a second injection-molded portion, the first injection-molded portion corresponds to a side of the electronic device and the second injection-molded portion extends from the first injection-molded portion to an inside of the electronic device and includes a coupling member to couple to the electronic device.

15. The case of claim 14, wherein the at least one case comprises a side surface case coupled to the rear surface of the front surface case, and a battery cover covering a rear surface of the side surface case, and the side surface case is exposed to a side surface of the electronic device.

16. The case of claim 15, wherein the injection preform of the side surface case comprises:
  the first injection-molded portion located between the front surface case and the battery cover of the electronic device, and exposed to the outside to form a side surface of the electronic device; and
  the second injection-molded portion extending from the first injection-molded portion, and coupled to the rear surface of the front surface case, and
  wherein the recess is formed on a surface of the first injection-molded portion, and the deposition layer is provided on a surface of the first injection-molded portion.

17. The case of claim 16, wherein the first injection-molded portion is formed through seamless injection-molding.

18. The case of claim 17, further comprising:
  a rib protruding from an inner surface of the first injection-molded portion,
  wherein the first injection-molded portion has a uniform thickness, and a thickness of the rib is 50% or less of the thickness of the first injection-molded portion.

19. The case of claim 15, wherein the injection preform comprises:
  a third injection-molded portion provided at a periphery of a display of the electronic device and provided at a portion exposed to the outside; and
  a fourth injection-molded portion extending from the third injection-molded portion and coupled to a side case of the electronic device,
  wherein the recess is formed in the third injection-molded portion and the deposition layer is provided on a surface of the third injection-molded portion.

20. The case of claim 19, wherein the third injection-molded portion has a uniform thickness and is formed through seamless injection-molding.

21. The case of claim 15, wherein one surface of the injection preform of the battery cover is entirely exposed to the outside, and a rib for attachment and detachment of the battery cover is provided on an inner surface of the injection preform.

22. The case of claim 21, wherein the injection preform of the battery cover has a uniform thickness, and the rib is formed along a periphery of an inner surface of the injection preform and has a thickness of 50% or less of the thickness of the injection preform of the battery cover.

* * * * *